United States Patent [19]

Chihara

[11] 4,037,399
[45] July 26, 1977

[54] ELECTRONIC TIMEPIECE BATTERY POTENTIAL DETECTING CIRCUITRY

[75] Inventor: Hiroyuki Chihara, Suwa, Japan

[73] Assignee: Kabushiki Kaisha Suwa Seikosha, Tokyo, Japan

[21] Appl. No.: 616,347

[22] Filed: Sept. 24, 1975

[30] Foreign Application Priority Data

Sept. 24, 1974 Japan .............................. 49-109808

[51] Int. Cl.² .......................... G04C 3/00; G08B 21/00
[52] U.S. Cl. ................................... 58/23 BA; 340/249
[58] Field of Search ............. 58/23 A, 23 BA, 152 H; 317/31; 320/13; 340/248 R, 248 A, 249

[56] References Cited

U.S. PATENT DOCUMENTS

| | | | |
|---|---|---|---|
| 3,383,522 | 5/1968 | Apfelbeck et al. | 340/248 B |
| 3,898,790 | 8/1975 | Takamune et al. | 58/152 H |
| 3,912,977 | 10/1975 | Fillmore | 317/31 |
| 3,916,262 | 10/1975 | Easter | 317/31 |

Primary Examiner—E. S. Jackmon
Attorney, Agent, or Firm—Blum, Moscovitz, Friedman & Kaplan

[57] ABSTRACT

An electronic timepiece battery-potential detecting circuit uneffected by temperature changes is provided. The electronic timepiece includes a D.C. power source such as a battery for providing an effective potential for energizing the timekeeping circuitry and display thereof. An electronic switching circuit is provided for detecting the effective potential of the D.C. power source. The electronic switching circuit includes a first stage switching element having a control electrode coupled to the power source for detecting the effective potential thereof, and two further electrodes defining a closed current path having either a first positive or negative current temperature coefficient in response to the control electrode being referenced above a predetermined potential, the two further electrodes defining a closed current path in response to the potential detected by the control electrode being above a predetermined potential, and a second stage switching element having a control electrode coupled to one of the first stage element further electrodes for detecting the potential thereof, the second stage element including further electrodes defining a closed current path having either a positive or negative current temperature coefficient opposite from the first stage element in response to the second stage element control electrode being referenced below the predetermined potential, the two further electrodes of the second stage element defining a closed current path.

40 Claims, 6 Drawing Figures

ELECTRONIC TIMEPIECE BATTERY POTENTIAL DETECTING CIRCUITRY

BACKGROUND OF THE INVENTION

This invention is directed to an electronic timepiece battery-potential detecting circuit, and in particular, to a battery-potential detecting circuit that is uneffected by changes in the ambient temperature.

Battery-potential detecting circuits for detecting the effecting potential of a battery utilized to drive the component elements of an electronic timepiece have taken on various forms. Although an electronic timepiece is effectively driven by a D.C. battery as long as same remains above a predetermined potential, once the D.C. battery drops below such a predetermined potential, not only will the battery not provide a sufficient potential to energize the electronic timepiece, but moreover, the effective potential of the D.C. battery rapidly diminishes thereafter. Accordingly, battery-potential detecting circuits for indicating when the effective potential of the battery has dropped below a useful value have been provided.

Due to the use of integrated circuit techniques in fabricating electronic timepieces, battery-potential detecting circuits completely formed from solid state switching elements such as MOS-FET transistors have been developed. Nevertheless, because the operating characteristic of such MOS transistors are affected by changes in ambient temperature, such MOS-FET battery-potential detecting circuits have been less than completely satisfactory.

SUMMARY OF THE INVENTION

Generally speaking, in accordance with the invention, an electronic timepiece battery-potential detecting circuit adapted to be uneffected by changes in ambient temperature is provided. The electronic timepiece includes an oscillator circuit for producing a high frequency time standard signal, a divider circuit for producing a low frequency timekeeping signal in response to the high frequency time standard signal and a display for displaying time in response to the timekeeping signal, the oscillator and divider circuits and display being energized by a D.C. power source producing an effective potential for such purpose. An electronic switching circuit for detecting the effective potential produced by the D.C. power source include a first stage switching element having a control electrode coupled to the D.C. power source for detecting the potential thereof. The first stage switching element includes two further electrodes adapted to define a closed circuit having either a first negative or first positive current temperature coefficient in response to the control electrode being referenced above a predetermined potential, the two further electrodes defining a change in impedance in response to the effective potential detected by the control electrode dropping to the predetermined voltage. A second stage switching element includes a control electrode coupled to one of the first stage switching element further electrodes and two further electrodes adapted to define a closed circuit having a second either positive or negative current temperature coefficient opposite from the first current temperature coefficient in response to the control electrode being referenced below the predetermined potential, the two further electrodes defining a change in impedance in response to a change in the effective potential detected by the control electrode.

Accordingly, it is an object of this invention to provide an improved electronic timepiece battery-potential detecting circuit that is not temperature dependent.

A further object of the invention is to provide an improved electronic timepiece battery-potential detecting circuit for indicating a drop in the potential of the battery below a predetermined potential.

Still a further object of the invention is to provide an improved two-stage MOS transistor battery-potential detecting circuit wherein the current temperature coefficient characteristics of the respective transistors compensate for changes in ambient temperature.

Still other objects and advantages of the invention will in part be obvious and will in part be apparent from the specification and drawings.

The invention accordingly comprises the features of construction, combinations of elements, and arrangement of parts which will be exemplified in the contructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

The instant invention is directed to a battery-potential detecting circuit particularly suitable for use in an electronic timepiece adapted to be energized by a D.C. battery $E_1$. Such electronic timepieces of the type to which the battery-potential detecting circuit of the instant invention is directed include an oscillator circuit including a high frequency time standard, such as a quartz crystal vibrator, for producing a high frequency time standard signal, a divider circuit formed from a plurality of divider stages and a display. The divider circuit is adapted to receive the high frequency time standard signal produced by an oscillator circuit and divide same down to thereby produce a low frequency timekeeping signal representative of present time. The display, either digital or mechanical, is coupled to the divider and in response to the timekeeping signal produced thereby displays present time. Referring to the battery-potential detecting circuit depicted in FIG. 1, such circuits are coupled to the battery utilized to energize the oscillator circuit, divider circuit and display and usually include an indicator coupled to the output thereof for providing an indication detectable by the user when the D.C. potential of the power source $E_1$ is dropped to a predetermined potential.

Figure 1:
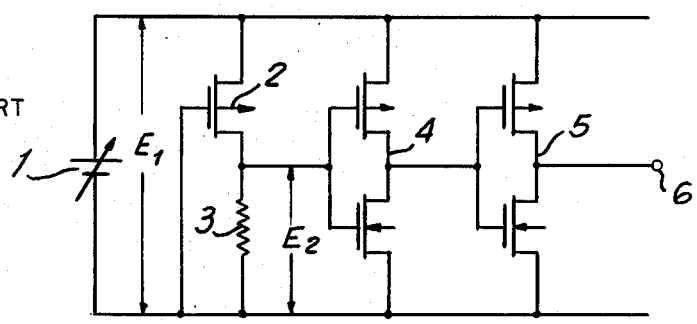
FIG. 1 is a detailed circuit diagram of a battery-voltage detecting circuit constructed in accordance with the prior art.

Referring specifically to FIG. 1, the D.C. battery $E_1$ is depicted as a variable power supply 1 for facilitating the explanation below. An enhancement type field-effect transistor 2 (P-MOS-FET) is coupled by the source electrode and gate electrode thereof across the variable potential $E_1$. The drain electrode of transistor 2 is coupled through resistor 3 to a reference potential. When transistor 2 is in a conductive state, the current path defined by the souce and drain electrodes effect a potential drop across the resistor 3, which potential is a detecting potential $E_2$. Detecting potential $E_2$ is applied to two cascaded C-MOS inverter stages 4 and 5, which inverter stages effect respective inversions of the detecting voltage pulse at the output 6 of inverter stage 5. Accordingly, when the source and drain electrodes of the transistor 2 define an open current path, and the potential $E_2$ drops below the threshold potential required to effect operation of the respective inverter stages 4 and 5, an effective change in the binary state at the output terminal 6 is effected.

Figure 2:
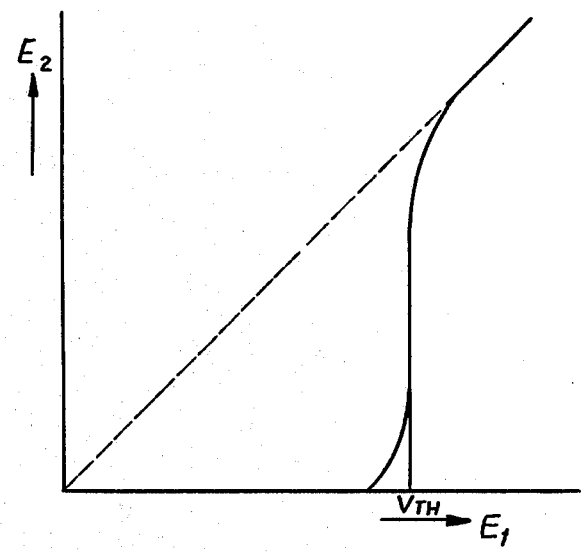
FIG. 2 is a graphical comparison of the change in potential $E_2$ in response to a change in the potential $E_1$ of the circuit depicted in FIG. 1.

Referring to FIG. 2, the operation of the battery-potential detecting circuit depicted in FIG. 1 is illustrated. When the effective potential of the D.C. battery 1 is above the threshold potential $V_{TH}$ of the P-MOS-FET transistor 2, the transistor is placed in a conductive state thereby effecting current flow through resistor 3 and hence rendering the change in detectionvoltage $E_2$ to be equal to the change in voltage $E_1$ as same changes. Nevertheless, as the battery potential $E_1$ approaches the threshold voltage $V_{TH}$ the detection voltage $E_2$ rapidly falls to a zero potential. Accordingly, when the detection voltage $E_2$ is at a voltage corresponding to $E_1$, namely, when the transistor 2 is in a conductive state, an effective input is applied to the cascaded C-MOS inverters and thereby produces a like binary output at terminal 6 thereof. Nevertheless, as the battery voltage drops to the threshold voltage $V_{TH}$, the detection voltage $E_2$ rapidly drops to zero and hence below the threshold voltage of the inverters 4 and 5 and the output 6 is changed to the opposite binary state, thereby providing an indication that the potential of the D.C. battery has dropped to or below the predetermined potential.

In a practical embodiment, the threshold voltage of the P-MOS-FET transistor is usually half the effective potential of the battery since such a transistor is formed on the same integrated circuit chip substrate as the complementary MOS transistors defining the C-MOS inverters. Accordingly, the load resistor 3 has to have a low impedance and the relationship of the detection potential $E_2$ to the battery potential $E_1$ has to define a slope having a slight inclination if the detecting voltage $E_2$ is to be 90 to 95 percent of the effective potential at which the battery operates. Nevertheless, the greater the change in the impedance of resistor 3, the harder it is to ascertain the exact potential at which the transistor 2 will be switched.

Accordingly, by utilizing the P-MOS-FET transistor 2 in a switching mode, whereby the threshold voltage thereof is utilized to detect a drop in the effective potential of a battery and in response thereto provide an indication that thelife of the battery is nearing completion, an effective detection circuit is provided. Nevertheless, changes in the threshold voltage of the transistor caused by changes in ambient temperature can render the indication by the detection circuit to be inaccurate or invalid. Unless temperature compensation is taken into account in the battery-voltage detecting circuit, the possibility exists that an indication could be provided if the battery potential is dropped, when in fact no such drop has occurred or alternatively, that such detection circuit will not detect a drop in the effective potential of the battery when same does in fact drop. Accordingly, a feature of the instant invention is the improvement of the characteristic of the battery-voltage detecting circuit characterized by compensating for the temperature characteristic of the MOS-FET transistor 2, which element contributes significantly to faulty detection of the battery-potential in response to changes in ambient temperatures.

Because the detection voltage $E_2$ is responsive to the drain current of the MOS-FET transistor 2, the temperature characteristic of the drain current $I_D$ is important in determining the temperature characteristic of the detection circuit. The relationship between the temperature characteristic of the drain current $I_D$ of P-MOS-FET transistor 2 and the threshold voltage $V_{TH}$, when the drain voltage $V_D$ is maintained constant is as follows:

$$\frac{1}{I_D} \cdot \frac{dI_D}{dT} = \frac{1}{\mu n} \cdot \frac{d\mu n}{dT} + \left( \frac{-1}{(V_G - V_{TH})} \cdot \frac{dV_{TH}}{dT} \right) \quad \text{---} \quad (1)$$

Wherein,
$V_G$ is the gate to source voltage, hereinafter referred to as the "gate voltage",
$\mu n$ is the mobility of electrodes in the inversion layer, and
$V_{TH}$ is the threshold voltage.

As both $du n/dT$ and $dV_{TH}/dT$ are negative values respectively, the temperature dependency characteristic of the drain current $I_D$ of MOS-FET transistor 2 can be rendered positive, negative or zero by suitably selecting the gate-threshold voltage difference potential $(V_G - V_{TH})$ and the derivative of the threshold voltage $dV_{TH}/dT$. Accordingly, the relationship between the gate-threshold difference potential $(V_G - V_{TH})$ and the drain current $I_D$ temperature coefficient is graphically illustrated in FIG. 3, which figure illustrates the variation of the drain current temperature coefficient in response to the gate-threshold difference potential.

Although it would be preferred to make the drain current $I_D$ temperature coefficient zero in a voltage-detecting circuit, achieving such a zero temperature coefficient in a battery-voltage detecting circuit for use in an electronic wristwatch is difficult due to the operating parameters thereof. Specifically, the threshold voltage $V_{TH}$ must be elevated to about 1.0V in order to provide $V_{TH}$ at an optimum value and make the drain current $I_D$ temperature coefficient zero at the vicinity of $V_G = 1.5V$. Nevertheless, since the battery-potential detecting circuit is fabricated on the same IC chip as the remaining electronic timepiece and voltage detection circuit elements, such an elevation of the first stage threshold voltage detection would cause a likewise elevation in the threshold voltage of the remaining transistor elements included on the IC chip. Such elevation of the threshold voltages of the transistors on the chip will cause deterioration in the precision of the timepiece, destabilization of the oscillator circuit, drops in the driving current and a decline in the noise-resistance characteristic of the divider circuit. Accordingly the raising of the threshold voltage to obtain a zero-temperature coefficient renders the operation of the electronic wristwatch and battery detection circuitry less than completely satisfactory.

Accordingly, the instant invention is directed to utilizing circuit elements in the second stage of the detecting circuit for compensating for changes in the threshold voltage of the first stage detecting transistor caused by the temperature characteristic thereof. The instant invention is particularly directed to utilizing the temperature dependency characteristic of the output voltage and switching voltage of MOS transistors to provide first and second stage temperature characteristic compensation. Referring specifically to the complementary inverter circuits 4 and 5 comprised of P-channel and N-channel transistors depicted in FIG. 1, the drain-current $I_D$ temperature coefficients of both the N-channel MOS-FET transistors are illustrated by the equation detailed above. At the gate voltage wherein switching of the transistor is effected, both such gate voltages have values near the threshold voltage. Accordingly, the drain current $I_D$ temperature coefficient of both are positive. Thus the impedance between the drain and source of both P and N MOS-FET transistors are changed in accordance with the changes in temperature, thereby demonstrating that while temperature changes change the switching voltage or the output voltage, when a single MOS-FET transistor is utilized and the only load thereon is the impedance in the source-drain current path, the load impedance is not able to compensate for the changes in temperature characteristics of the MOS-FET transistor. Specifically, the changes in the temperature characteristics of the MOS-FET directly effect the switching voltage or the output voltage of the first detection stage, thereby rendering it necessary to provide an element for absorbing the changes in the first switching transistor stage caused by changes in ambient temperature by utilizing an impedance load instead of the complementary CMOS inverter circuit of the type utilized in the prior art as the second stage.

Figure 3:
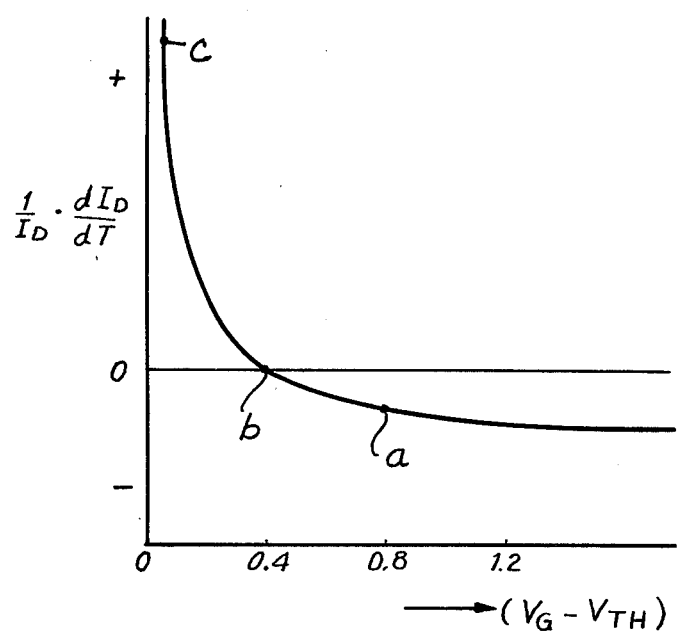
FIG. 3 is a graphical illustration of the changes in the source-drain electrode current temperature coefficient in response to an increase in the potential difference between the gate electrode and threshold voltage of a P-MOS-FET.
Figure 4:
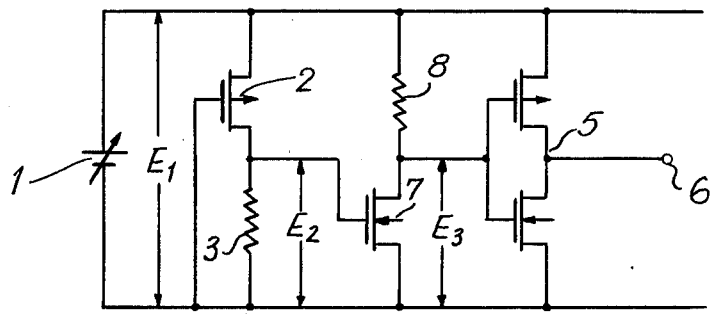
FIG. 4 is a detailed circuit diagram of a battery-potential detecting circuit constructed in accordance with a preferred embodiment of the instant invention.

Reference is now made to FIG. 4 wherein a battery-voltage detection circuit constructed in accordance with a preferred embodiment of the instant invention is depicted, like reference numerals being utilized to denote like elements depicted in FIG. 1. Accordingly, the first detection state is comprised of P-channel MOS-FET transistor 2 and resistor 3. A second detection stage includes a N-MOS-transistor 7 and load resistor 8. For the circuit illustrated in FIG. 4, the threshold voltage of the P-MOS-FET transistor 2 is 0.7V and the gate voltage at which the drain current $I_D$ temperature coefficient becomes zero is approximately 1.1V. Accordingly, when the predetermined detecting voltage is 1.5V, the drain current $I_D$ temperature coefficient of the first stage P-channel MOS-FET transistor 2 is, as noted in FIG. 3 negative within the range of the supply voltage between the effective battery potential 1.58V and the predetermined detecting voltage 1.50V.

Accordingly, if the supply voltage is within the range between the effective battery potential 1.58V and the predetermined detecting voltage 1.50V, the P-MOS-FET transistor 2 and N-MOS-FET transistor 7 are maintained in the ON state, whereby same define closed source-drain current paths when the ambient temperatures are stable. Nevertheless, as discussed hereinabove, since the drain current $I_D$ temperature coefficient of the P-MOS-FET transistor is negative over the range of the supply voltage $E_1$, the impedance of the source-drain electrode current path of the P-MOS transistor 2 increases as ambient temperature increases and hence causes the output voltage $E_2$ of the first switching stage to be decreased. Accordingly, the gate source potential of the N-MOS-FET transistor 7 is reference above the first stage output potential $E_2$, so that when the output potential $E_2$ of the first stage decreases with respect to a rise in ambient temperature, such increase effects an increase in the impedance of the drain source current path of the N-MOS-FET transistor 7. Nevertheless, the threshold-gate potential ($V_G - V_{TH}$) of the N-MOS-FET transistor 7 is near zero since the gate-source potential difference of the transistor 7 has a value near the threshold voltage. Thus, the drain current $I_D$ temperatue coefficient of transistor 7 is positive, so that the impedance of the drain-source current path decreases in response to a rise in ambient temperature.

Accordingly, the resultant decrease in the impedance of the source-drain current path of the transistor 7 defining the second stage of the detection circuit compensates for the increases caused by rises in ambient temperature to the impedance of the drain-source current path defined by the first detection stage transistor 2. Accordingly, sufficient compensation of the increases in the impedance of the first transistor stage in response to rises in ambient temperature are effected by the second stage transistor compensating therefor to thereby substantially improve operation of the voltge-detection circuit.

The foregoing embodiment and discussion directed thereto is directed to providing battery-potential detecting circuitry that remains uneffected by rises in ambient temperature. Nevertheless, the instant invention is also directed to the drain current $I_D$ temperature characteristic remaining uneffected in response to a decline in the ambient temperature, such characteristic depending in part on the amount of temperature compensation required. Referring to FIG. 3, the respective operating point a and c of the P-MOS-FET and N-MOS-FET transistors depicted in FIG. 4 are illustrated. Accordingly, the absolute value of the temperature coefficient at point c is high since the gate voltage $V_G$ is near the threshold voltage $V_{TH}$ and hence is on the order of ten times greater than the temperature coefficient at point a. For the example depicted in FIG. 2, the changes in the drain current cause proportional changes in the output potential of the second stage. Thus, for the circuit depicted in FIG. 4, as the drain current fluctuates and causes the corresponding fluctuation in the output voltage thereof, such fluctuations in the output potential of the first transistor stage, characterized as $\Delta E_2$ influence the output voltage $E_3$ of the second MOS transistor stage by effecting amplification $\beta$ of the actuations thereof. Specifically, the changes in the output voltage of the second stage are equal to $\beta \Delta E_2$ in response to changes in the output voltage $E_2$ of the first stage caused by changes in the first stage transistor by changes in ambient temperatures.

Accordingly, since the changes in the output voltage of the second stage $\Delta E_2$ caused by changes in temperature are also effected in the second stage transistor, such as N-MOS-FET transistor 7 in FIG. 4, the change occurring at the second stage is still ten times greater than that occurring at $\Delta E_2$. Thus, if the $\beta$ is recognized to be on the order of 10, same can be compensated for by properly selecting the load resistance values. Specifically, the amount of temperature compensation can be controlled by operating for load resistance value at the second stage portion.

Figure 5:
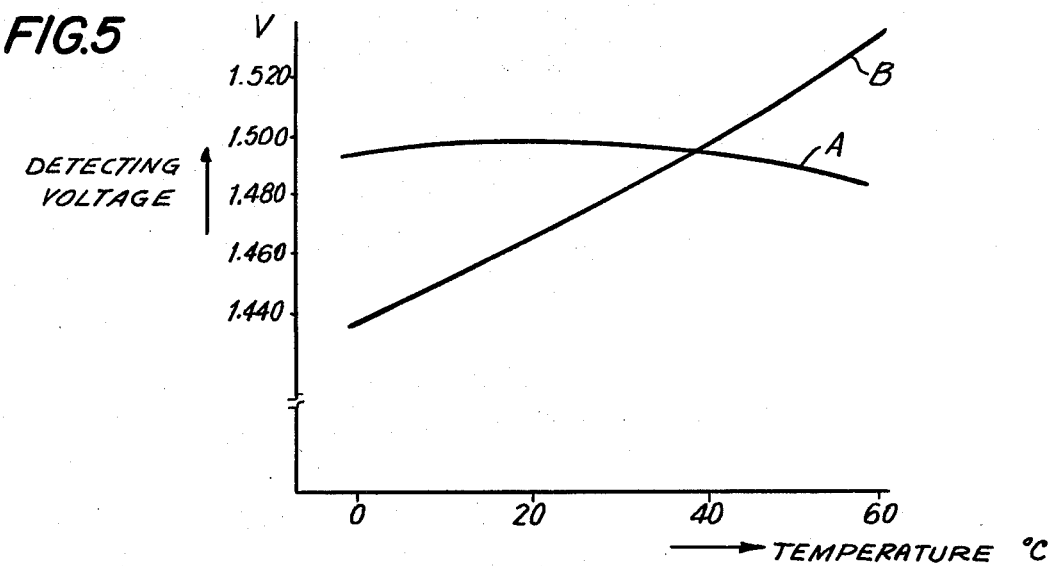
FIG. 5 is a graphical illustration of the current temperature characteristic of a battery-voltage detecting circuit constructed in accordance with the preferred embodiment of the instant invention depicted in FIG. 2 and the temperature characteristic of the prior art embodiment depicted in FIG. 1.

Referring specifically to FIG. 5, the changes in detecting voltage with respect to temperature of the battery-potential detecting circuit depicted in FIG. 4 is illustrated as A, and the changes in detecting voltage with respect to changes in ambient temperature of a battery-potential detecting circuit of the type depicted in FIG. 1 wherein the second stage is a complementary-coupled inverter stage is depicted as B. As is readily apparent therefrom, the changes in detecting voltage are substantially minimized by the instant invention.

Figure 6:
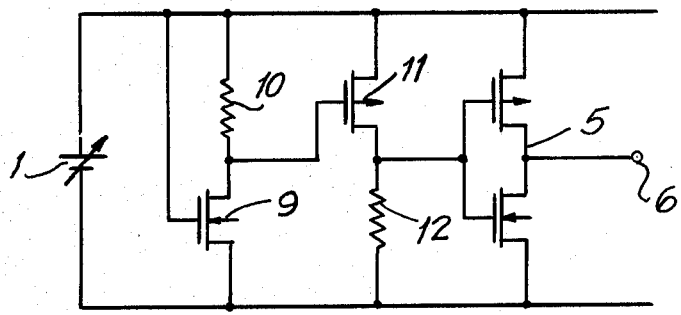
FIG. 6 is a detailed circuit diagram of a battery-voltage detecting circuit constructed in accordance with an alternate embodiment of the instant invention.

Referring now to FIG. 6, a battery-potential detecting circuit wherein the first stage detecting unit resistor has a negative temperature coefficient is depicted, like reference numerals being utilized to denote like elements depicted in FIG. 1. The first stage includes a MOS-FET transistor 9 having a negative drain current $I_D$ temperature coefficient over the range of the effective supply voltage $E_1$ from the battery 1 and the predetermined detecting voltage when same is in a conductive state. Additionally, the low resister 10 is disposed between the source-drain current path and the supply potential of the battery 1. The second stage is therefore comprised of a P-MOS-FET transistor 11 having a positive drain current $I_D$ temperature coefficient when the source-drain current path is conducted, the current path being conducted to a reference potential through a loaded resister 12. Thus, the second stage of switching transistor compensates for any changes in the output potential of the first stage transistor 9 in response to changes in the ambient temperature thereof.

It is noted, that when the MOS-FET transistor has a positive drain current temperature characteristic when same is utilized as a first detecting stage transistor for detecting the potential within the range between the effective battery potential and the predetermined detecting voltage, if the first stage transistor is a P-MOS-FET, the temperature compensation is effected by using a P-MOS-FET at the next stage portion, and if the first stage portion is a N-MOS-FET, the temperature compensation is effected by utilizing a P-MOS-FET at the next stage portion, and if the first stage portion is a N-MOS-FET the temperature compensation is effected by utilizing a N-MOS-FET transistor at the second stage. Moreover, the load impedance of both stages of the detecting circuit can be comprised of MOS impedances to effect the benefits of the instant invention.

A further embodiment in accordance with the instant inventin is to utilize a complementary coupled MOS inverter circuit as the second detecting stage and by utilizing transistors having different P-channel and N-channel characteristics, thereby causing the net temperature coefficient of the inverter circuit to compensate for the changes in the output produce by the first stage in response to changes in ambient temperature. It is noted that the instant invention is equally applicable to detection circuits formed of junction type field effect transistors.

It is further noted that the instant inventin is equally applicable to battery-potential detection circuits utilized in other than electronic timepieces. For example, the instant invention is particularly suited for use in analog to digital converters, electronic table calculators, voltage preparing circuitry utilized with thermometers and other circuitry utilizing field effect transistors wherein it is desired that same be uneffected by changes in ambient temperature.

Finally, the instant invention is particularly characterized by effectively compensating for changes in temperature in circuitry monolithically integrated on a single circuit chip without utilizing conventional temperature sensitive elements such as thermistors and the like. Accordingly, the instant invention is particularly suitable for being included in the same circuit chip as the electronic timepiece circuitry to thereby improve same.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In an electronic timepiece comprising oscillator means for producing a high frequency time standard signal, divider means for producing a low frequency timekeeping signal in response to said high frequency time standard signal, and display means for displaying time in response to the said timekeeping signal, the improvement comprising a DC power source for energizing said oscillator, divider and display means, said power source means being adapted to produce an effective potential for such energizing, and electronic switching means for detecting the effective potential produced by said power source means, said electronic switching means including first stage switching means and second stage switching means, said first stage switching means including a first control electrode coupled to said power source for detecting the effective potential thereof, said first stage means further including two further electrodes adapted to define a closed current circuit having one of a first positive and negative current temperature coefficient in response to said control electrode being referenced above a predetermined potential, said two further electrodes defining one of an increased and decreased impedance in response to said control electrode detecting a drop in the effective potential of said power source, and said second stage switching means having a control electrode coupled to one of said first stage means further electrodes for detecting the potential thereof when same defines a closed current path, said second stage further including two further electrodes defining a closed circuit having one of a positive and negative second temperature coefficient opposite to said first current temperature coefficient in response to said control electrode being referenced below said predetermined potential, said two further electrodes of said second stage means defining a circuit for compensating for changes in one of said increased and decreased impedance of said two further electrodes of said first stage means due to changes in temperature when said second stage swithcing means control electrode detects a change in the effective potential of said first stage switching means further electrodes.

2. An elelectronic timepiece as claimed in claim 1, wherein said first and second stage switching means include MOS field effect transistors having a gate electrode corresponding to said respective control electrodes and source and drain electrodes corresponding to said further electrodes, said drain electrodes having said first and second opposite temperature coefficients.

3. An electronic timepiece as claimed in claim 2, wherein said power source has rated voltage, said first stage switching means being selected to have one of said first and second drain current temperature coefficients in a range of voltages between at least said predetermined potential and said rated voltage.

4. An electronic timepiece as claimed in claim 3, wherein said drain current electrode of said first stage switching means is referenced at a first indication potential in response to the range of voltages detected by said control electrode being between at least said predetermined potential and said rated voltage, said second stage switching means being selected to have said second drain current temperature coefficient opposite to said first stage transistor drain current temperature coefficient between at least said further predetermined potential and said first indication potential.

5. An electronic timepiece as claimed in claim 4, wherein the MOS transistor of said first stage switching means has a negative drain current temperature coefficient and the MOS transistor of said second stage switching means has a positive drain current temperature coefficient.

6. An electronic timepiece as claimed in claim 5, wherein said first stage switching means includes a P-MOS-FET transistor and an N-MOS-FET transistor and said second stage switching means includes the other of a P-MOS-FET transistor and an N-MOS-FET transistor.

7. An electronic timepiece as claimed in claim 6, and including a first load resistor connected intermediate said second stage MOS transistor source-drain path and said rated potential.

8. An electronic timepiece as claimed in claim 7, wherein said power source includes a first terminal referenced to said rated potential and a second terminal referenced to a reference potential, and including a second load resistor connected intermediate said first stage MOS transistor source-drain path and said reference potential.

9. An electronic timepiece as claimed in claim 8, wherein at least one of said load resistors is selected to adjust the gain of the associated stage so that the net temperature coefficient of said first and second stages is substantially zero in a range of voltages between about said rated voltage and about said predetermined voltage.

10. An electronic timepiece as claimed in claim 4, wherein said first and second stage switching means both include one of P-MOS-FET transistor and an N-MOS-FET transistor, said first stage MOS transistor having a positive current temperature coefficient.

11. An electronic timepiece as claimed in claim 9, and including a first load resistor connected intermediate said second stage MOS transistor and said reference potential.

12. An electronic timepiece as claimed in claim 11, wherein said power source includes a first terminal referenced at a rated voltge and a second terminal reference at a reference potential, and including a second load resistor connected intermediate said first stage MOS transistor and said rated potential.

13. An electronic timepiece as claimed in claim 12, wherein at least one of said load resistors is selected to adjust the gain of the associated stage so that the net temperature coefficient of said first and second stages is substantially zero in a range of voltages between about said rated voltage and about said predetermined voltage.

14. An electronic timepiece as claimed in claim 4, and includng further detection circuit means coupled to said source-drain electrodes of the MOS transistor of the second stage switching means, said further detection circuit means producing a first voltage level in response to the open circuit condition of said second stage switching transistor source-drain electrodes, and producing a second voltage level in response to said second stage electrodes defining a closed current path.

15. An electronic timepiece as claimed in claim 14, wherein said further detection circuit means includes an inverter circuit having an input and output, the input of the inverter circuit being connected to one of said source-drain electrodes, the respective first and second voltage levels being produced at the output of said inverter circuit.

16. An electronic timepiece as claimed in claim 15, wherein said inverter circuit is formed of complementary coupled P-channel and N-channel MOS-FET transistors.

17. An electronic timepiece as claimed in claim 11, wherein said second stage switching means includes an inverter circuit formed from MOS transistors selected to have said second drain current temperature coefficient.

18. In an electronic timepiece comprising oscillator means for producing a high frequency time standard signal, divider means for producing a low frequency timekeeping signal in response to said high frequency time standard signal, and display means for displaying time in response to the said timekeeping signal, the improvement comprising a DC power source for energizing said oscillator, divider and display means, said power souce means being adapted to produce an effective potential for such energizing, and electronic switching means for detecting the effective potential produced by said power source means, said electronic switching means including first stage switching means and second stage switching means, said first and second stage switching means both including an MOS transistor said first stage switching means MOS transistor including a gate electrode coupled to said power source for detecting the effective potential thereof and a source-drain path to define a closed current circuit having a selected first drain current temperature coefficient in response to said gate electrode being referenced to a potential that is one of a potential above a predetermined potential and a potential that is below a predetermined potential, said source-drain path of said first stage switching means defining one of an increased and decreased impedance in response to said gate electrode detecting a drop in the effective potential of said power source, and said MOS transistor of said second stage switching means having a gate electrode coupled to said first stage means source-drain path for detecting the potential thereof when same defines a closed current path, said MOS transistor of said second stage further including a source-drain path defining a closed circuit having a selected second drain current temperature coefficient opposite to said first drain current temperature coefficient in response to the gate electrode of said second stage MOS transistor being referenced to one of a potential that is above said predetermined potential in response to said first stage MOS transistor gate electrode being referenced below said predetermined potential and below said predetermined potential in response to said first stage MOS transistor gate electrode being referenced to a potential that is above said predetermined potential, said source-drain path of said second stage MOS transistor defining a circuit for compensating for a change in the positive and negative impedance of said first stage means source-drain path due to changes in temperature when said second stage switching means gate electrode detects a change in the effective potential of said first stage switching means source-drain path.

19. An electronic timepiece as claimed in claim 18, wherein said first and second stage switching means both include one of a P-MOS-FET transistor and an N-MOS-FET transistor, the drain current temperature coefficient of said first stage MOS transistor being positive.

20. An electronic timepiece as claimed in claim 18, wherein said first stage switching means includes one of a P-MOS-FET transistor and an N-MOS-FET transistor, said second stage switching means including the other of a P-MOS-FET transistor and an N-MOS-FET transistor, the drain current temperature coefficient of said first stage MOS transistor being negative.

21. In combination with a DC power source for producing an operable output voltage over an effective potential range, means for detecting the impending failure of said power source including electronic switching means for detecting effective potential produced by said power means, said electronic switching means including first stage switching means and second stage switching means, said first stage switching means including a first control electrode coupled to said power source for detecting the effective potential thereof, said first stage means further including two further electrodes adapted to define a closed current circuit having one of a positive and negative current temperature coefficient in response to said control electrode being referenced above a predetermined potential, said two further electrodes defining one of an increased and decreased impedance in response to said control electrode detecting a drop in the effective potential of said power source, and said second stage switching means having a control electrode coupled to one of said first stage means further electrodes for detecting the potential thereof when same defines a closed current path, said second stage further including two further electrodes defining a closed circuit having one of a positive and negative second temperature coefficient opposite to said first current temperature coefficient in response to said second stage control electrode being referenced below said predetermined potential, said two further electrodes defining a circuit for compensating for one of an increase and decrease in the impedance of said first stage further electrodes due to changes in temperature when said second stage switching means control electrode detects a change in the effective potential of said first stage switching means further electrodes.

22. Power source failure detecting means as claimed in claim 21, wherein said first and second stage switching means include MOS field effect transistors having a gate electrode corresponding to said respective control electrodes and source and drain electrodes corresponding to said further electrodes, said drain electrodes having said first and second opposite temperature coefficients.

23. Power source failure detecting means as claimed in claim 22, wherein said power source has a rated voltage, said first stage switching means being selected to have one of said first and second drain current temperature coefficients in a range of voltages between at least said predetermined potential and said rated voltage.

24. Power source failure detecting means as claimed in claim 23, wherein said drain current electrode of said first stage switching means is referenced at a first indication potential in response to the range of voltages detected by said control electrode being between at least said predetermined potential and said rated voltage, said second stage switching means being selected to have said second drain current temperature coefficient opposite to said first stage transistor drain current temperature coefficient between at least said further predetermined potential and said first indication potential.

25. Power source failure detecting means as claimed in claim 24, wherein the MOS transistor of said first stage switching means has a negative drain current temperature coefficient and the MOS transistor of said second stage switching means has a positive drain current temperature coefficient.

26. Power source failure detecting means as claimed in claim 25, wherein said first stage switching means includes a P-MOS-FET transistor and an N-MOS-FET transistor and said second stage switching means includes the other of a P-MOS-FET transistor an an N-MOS-FET transistor.

27. Power source failure detecting means as claimed in claim 26, and including a first load resistor connected intermediate said second MOS transistor source-drain path and said rated potential.

28. Power source failure detecting means as claimed in claim 27, wherein said power source includes a first terminal referenced to said rated potential and a second terminal referenced to a reference potential, and including a second load resistor connected intermediate said first stage MOS transistor source-drain path and said reference potential.

29. Power source failure detecting means as claimed in claim 28, wherein at least one of said load resistors is selected to adjust the gain of the associated stage so that the net temperature coefficient of said first and second stages is substantially zero in a range of voltages between about said rated voltage and about said predetermined voltage.

30. Power source failure detecting means as claimed in claim 24, wherein said first and second stage switching means both include one of P-MOS-FET transistor and an N-MOS-FET transistor, said first stage MOS transistor having a positive current temperature coefficient.

31. Power source failure detecting means as claimed in claim 29, and including a first load resistor connected intermediate said second stage MOS transistor and said reference potential.

32. Power source failure detecting means as claimed in claim 31, wherein said power source includes a first terminal referenced at a rated voltage and a second terminal reference at a reference potential, and including a second load resistor connected intermediate said first stage MOS transistor and said rated potential.

33. Power source failure detecting means as claimed in claim 32, wherein at least one of said load resistors is selected to adjust the gain of the associated stage so that the net temperature coefficient of said first and second stages is substantially zero in a range of voltages between about said rated voltage and about said predetermined voltage.

34. Power source failure detecting means as claimed in claim 24, and including further detection circuit means coupled to said source-drain electrodes of the MOS transistor of the second stage switching means, said further detection circuit means producing a first voltage level in response to the open circuit condition of said second stage switching transistor source-drain electrodes, and producing a second voltage level in response to said second stage electrodes defining a closed current path.

35. Power source failure detecting means as claimed in claim 34, wherein said further detection circuit means includes an inverter circuit having an input and output, the input of the inverter circuit being connected to one of said source-drain electrodes, the respective first and second voltage levels being produced at the output of said inverter circuit.

36. Power source failure detecting means as claimed in claim 35, wherein said inverter circuit is formed of complementary coupled P-channel and N-channel MOS-FET transistors.

37. Power source failure detecting means as claimed in claim 31, wherein said second stage switching means includes an inverter circuit formed from MOS transistors selected to have said second drain current temperature coefficient.

38. Power source failure detecting means as claimed in combination with a D.C. power source for producing an operable output voltage over an effective potential comprising means for detecting the impending failure to said power source including electronic switching means for detecting the effective potential produced by said power source means, said electronic switching means including first stage switching means and second stage switching means, said first and second stage switching means each including an MOS transistor, said first stage switching means MOS transistor including a gate electrode coupled to said power source for detecting the effective potential thereof and a source-drain path to define a closed current circuit having a selected first drain current temperature coefficient in response to said gate electrode being referenced to one of a potential that is above a predetermined potential and a potential that is below a predetermined potential, said source-drain path of said first stage switching means defining one of an increased and decreased impedance in response to said gate electrode detecting a drop in the effective potential of said power source, and said MOS transistor of said second stage switching means having a gate electrode coupled to said first stage means source-drain path for detecting the potential thereof when same defines a closed current path, said MOS transistor of said second stage further including a source-drain path defining a closed circuit having a selected second drain current temperature coefficient opposite to said first drain current temperature characteristic in response to the gate electrode of said second stage MOS transistor being referenced to one of a potential that is above said predetermined potential in response to said first stage MOS transistor gate electrode being referenced to a potential that is below said predetermined potential and below said predetermined potential in response to said first stage MOS transistor gate electrode being referenced to a potential that is above said predetermined potential, said source-drain path of said second stage MOS transistor defining a circuit for compensating for one of said increased and decreased impedance of first stage switching means source-drain path caused by changes in temperature when said second stage switching means gate electrode detects a change in the effective potential of said first stage switching means source-drain path.

39. Power source failure detecting means as claimed in claim 38, wherein said first and second stage switching means both include one of a P-MOS-FET transistor and an N-MOS-FET transistor, the drain current temperature coefficient of said first stage MOS transistor being positive.

40. Power source failure detecting means as claimed in claim 38, wherein said first stage switching means includes one of a P-MOS-FET transistor and an N-MOS-FET transistor, said second stage switching means including the other of a P-MOS-FET transistor and an N-MOS-FET transistor, the drain current temperature coefficient of said first stage MOS transistor being negative.

* * * * *